(12) United States Patent
Komatsu

(10) Patent No.: US 6,175,494 B1
(45) Date of Patent: Jan. 16, 2001

(54) COOLING APPARATUS AND COOLING METHOD CAPABLE OF COOLING AN ENCAPSULATED TYPE HOUSING IN A HIGH COOLING EFFICIENCY

(75) Inventor: Kazuo Komatsu, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/256,771

(22) Filed: Feb. 24, 1999

(30) Foreign Application Priority Data

Mar. 12, 1998 (JP) .................................................. 10-078527

(51) Int. Cl.$^7$ ....................................................... H05K 7/20
(52) U.S. Cl. .......................... 361/692; 165/80.3; 174/16.1
(58) Field of Search ................... 174/15.1, 16.1, 174/16.3; 312/236; 454/184; 465/80.3, 185, 80.2, 129, 131; 257/722; 361/687, 690, 692, 697, 693, 694, 703, 704, 707, 724; 165/DIG. 327, DIG. 328

(56) References Cited

U.S. PATENT DOCUMENTS 3,961,666 * 6/1976 Suzuki .
4,015,173 * 3/1977 Nitsche .
4,241,380 * 12/1980 Lehmann .
4,535,386 * 8/1985 Frey, Jr. .
4,858,069 * 8/1989 Hughes .
5,105,336 * 4/1992 Jacoby .
5,398,159 * 3/1995 Andersson .

FOREIGN PATENT DOCUMENTS

| 62-166692 | 10/1987 | (JP) . |
| 4-56390 | 5/1992 | (JP) . |
| 5-6889 | 1/1993 | (JP) . |
| 5-102687 | 4/1993 | (JP) . |
| 7-83582 | 3/1995 | (JP) . |
| 7-94883 | 4/1995 | (JP) . |
| 7-113589 | 5/1995 | (JP) . |
| 7-131173 | 5/1995 | (JP) . |
| 7-41262 | 7/1995 | (JP) . |
| 9-130072 | 5/1997 | (JP) . |
| 9-191190 | 7/1997 | (JP) . |

* cited by examiner

Primary Examiner—Gerald Tolin
(74) Attorney, Agent, or Firm—Young & Thompson

(57) ABSTRACT

A cooling apparatus for cooling a housing includes a heat radiating member, a heat radiating unit, and a heat absorbing unit. The heat radiating member is provided in the housing and has a path formed to have an opening portion in an upper portion of the housing. The heat radiating unit is provided in at least a part of a surface of the path of the heat radiating member. The heat absorbing unit is provided in a peripheral portion of the heat radiating member such that heat radiated from the heat radiating unit is removed via the path from the opening portion of the heat radiating member by a chimney effect.

17 Claims, 4 Drawing Sheets

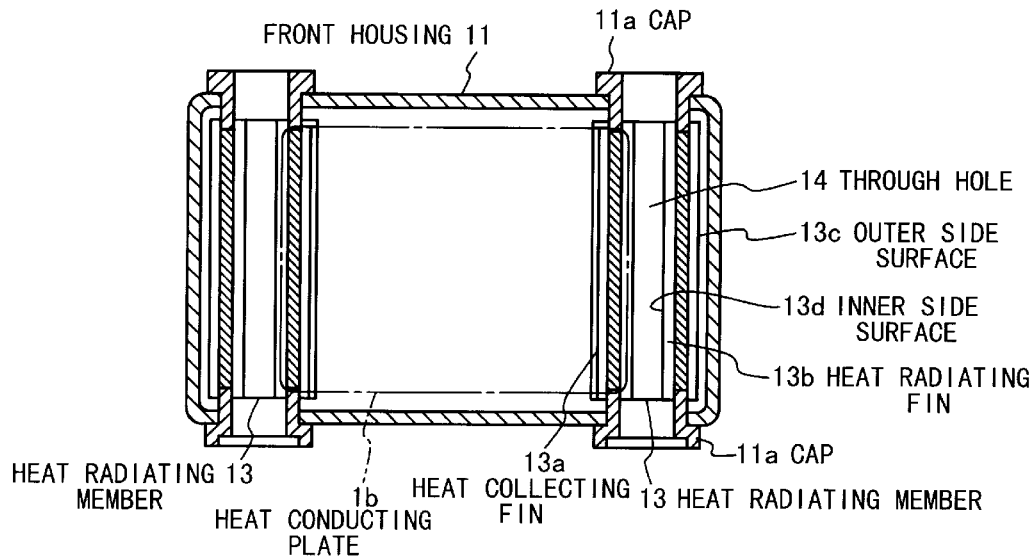
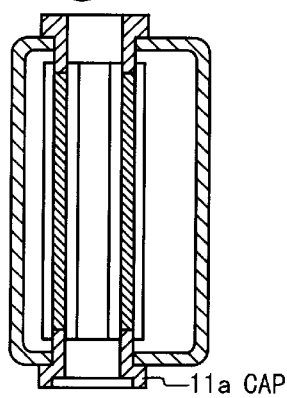
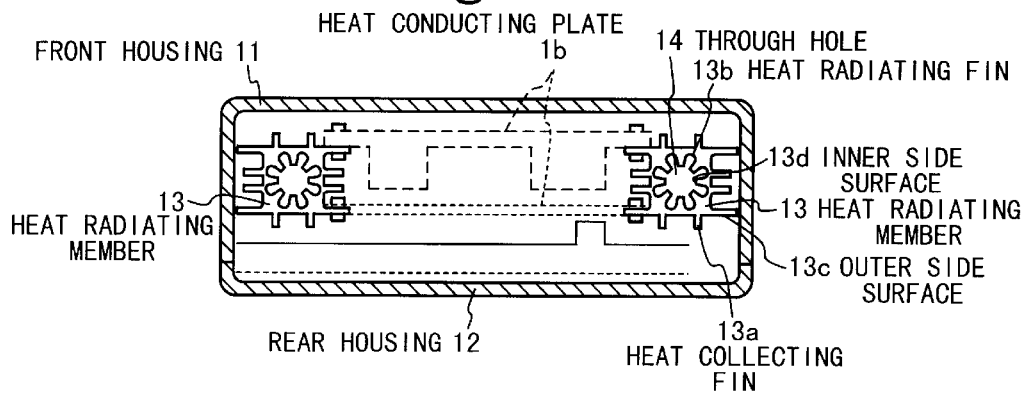

COOLING APPARATUS AND COOLING METHOD CAPABLE OF COOLING AN ENCAPSULATED TYPE HOUSING IN A HIGH COOLING EFFICIENCY

BACKGROUND OF THE INVENTION

1. Field of the Invention

The present invention generally relates to a method of cooling an encapsulated type housing, and a cooling apparatus for an encapsulated type housing. More specifically, the present invention is directed to a low-cost cooling method/cooling apparatus for an encapsulated, or sealed type housing, while a cooling efficiency and a waterproof characteristic are increased, and a total number of components is minimized.

2. Description of the Related Art

Conventionally, for instance, Japanese Laid Open Patent Application (JP-A-Heisei 5-102687) and Japanese Laid Open Patent Application (JP-A-Heisei 7-113589) describe cooling apparatuses for the sealed, or encapsulated type housings such as a sealed type cabinet used for a radio communication appliance used in an outdoor field. That is, these patent applications describe the heatpipe type cooling apparatuses equipped with the heat collecting fins installed inside the housings, and also the heat radiating fins installed outside the housings.

FIG. 1A is a front view for showing the conventional cooling apparatus for the sealed, or encapsulated type housing. FIG. 1B is a sectional view for showing this cooling apparatus, taken along a line III—III of FIG. 1A. FIG. 2 is a sectional view for representing this cooling apparatus, taken along a line II—II of FIG. 1A.

In this conventional cooling apparatus, three sets of heatpipes 5 are provided on the upper unit of the housing. The operating temperatures of these heatpipes 5 are different from each other. The heat collecting fin 4 is provided on the inside of the housing 1 of the heatpipes 5, whereas the heat radiating fin 4a is provided on the outside of the housing 1.

This heatpipe 5 is constructed in the form of a heatpipe assembly for assembling the heat collecting fin 4, the heat radiating fin 4a, the heat insulating material 1a, and the mounting plate 7 in an integral form. This heatpipe assembly is inserted into the housing 1 though a hole (not shown in detail). This hole is formed in the upper unit of the housing 1, and has a shape corresponding to the shape of the heat insulating material 1a of this heat pipe assembly. The mounting plate 7 of the heatpipe assembly is screwed on this housing 1. Furthermore, for example, this mounting plate 7 may be fixed by filling properly selected resin into a space formed in the hole. The sun-shade 6 is provided on the portion of this heatpipe assembly located at the outside from the housing 1.

The above-described conventional cooling apparatus for the sealed type housing has the following problems. That is, since the heat radiating fin 4a is exposed to the outside portion of the sealed type housing 1, this heat radiating fin 4a may absorb direct heat and/or radiation heat given from the sun. As a result, the internal temperature of this housing 1 would be conversely increased, contrary to its essential function of this heat radiating fin 4a.

Moreover, the sealing distance between the housing 1 and the heat radiating fin 4a which is largely exposed to the outside of the housing 1 is very long, resulting in deteriorations of the water-proofing characteristics and drip-proofing characteristics of the housing 1. In addition, since the size of the above-described hole is large, this may also cause the water-proofing/drip-proofing problems of the cooling apparatus. This hole formed in the upper unit of the housing 1 is employed to insert the heatpipe assembly into the housing 1.

Also, this conventional cooling apparatus owns another problem. That is, the expensive heatpipe type cooling device is required. In addition, since a very large number of structural components are required in this heatpipe type cooling device, and also a total number of assembling stages for the heatpipe type cooling device is needed. Therefore, total cost of the cooling apparatus would be increased.

On the other hand, Japanese Laid Open Utility Model Application (JPU-A-Heisei 7-41262) discloses the following cooling construction. That is, this disclosed cooling construction is equipped with the heat radiating fin 2 of the heat pipe 1, and the air duct 12. This heat radiating fin 2 is located outside the housing 11 which contains the heat radiating source 10. The air duct 12 is made in the continuous shape, and is used to exhaust air conducted thereinto from the housing 11 by contacting all amounts of this conducted air to the heat radiating fin 2. This air duct 12 is installed outside the housing 11. The heat radiating fin 2 is arranged at the upper portion of the penetration unit of the side wall of this housing 11.

However, this conventional heatpipe type cooling structure could not also solve the above-explained problems.

Further, Japanese Laid Open Patent Application (JP-A-Heisei 7-83582) discloses the below-mentioned cooling apparatus. That is, in this conventional cooling apparatus, the zig-zag type narrow-tube heatpipe 2 is provided to penetrate the separator plate 1. Both sides of the surface of this separator plate 1 are routed in the zig-zag path, so that the pin-fin group having a needle-point-holder shape is formed.

However, this conventional cooling apparatus could not also solve these problems.

SUMMARY OF THE INVENTION

The present invention has been made to solve the above-described problems of the conventional cooling apparatuses, and therefore, has an object to provide a cooling apparatus for a sealed, or encapsulated type housing. That is, this cooling apparatus is operable in a high heat cooling efficiency without employment of heatpipe type cooling devices and exposed type heat radiating members, while being adversely influenced by direct heating and/or radiation heating.

Also, another object of the present invention is to provide a cooling apparatus for a sealed, or encapsulated type housing. That is, in this cooling apparatus, since a sealing distance between a heat radiating member and a housing can be minimized, water-proofing/drip-proofing characteristics of this cooling apparatus can be improved. Moreover, this cooling apparatus can be easily manufactured in low cost, while requiring a limited number of structural components thereof, and being operable in the outdoor field.

In order to achieve an aspect of the present invention, a cooling apparatus for cooling a housing includes a heat radiating member provided in the housing and having a path formed to have an opening portion in an upper portion of the housing, a heat radiating unit provided in at least a part of a surface of the path of the heat radiating member and a heat absorbing unit provided in a peripheral portion of the heat radiating member, such that heat radiated from the heat radiating unit is removed via the path from the opening portion of the heat radiating member by a chimney effect.

In this case, the path is formed to extend along a substantially vertical direction of the housing.

Also in this case, the heat radiating member is formed in a substantially cylindrical shape, wherein the heat radiating unit is provided on an inner surface of the heat radiating member and wherein the heat absorbing unit is provided on an outer surface of the heat radiating member.

Further in this case, the heat radiating unit is formed to have a substantially concave shape or a substantially convex shape to increase a surface area of the path and wherein the heat absorbing unit is formed in a substantially convex shape.

In order to achieve another aspect of the present invention, the heat radiating member is formed in a substantially cylindrical shape, wherein the heat radiating unit has a concave portion and wherein the heat absorbing unit has a projecting portion.

In this case, the path has another opening portion in a lower portion of the housing in addition to the opening portion.

Also, in this case, the heat radiating member and the heat radiating unit are stored in the housing.

Further in this case, the housing is constructed of a plurality of structural portions, which are coupled to maintain a waterproof characteristic of the housing.

In this case, the housing is constructed of a plurality of structural portions, and wherein the heat radiating member is provided in one of the plurality of structural portions.

Also in this case, the cooling apparatus includes a plurality of the heat radiating members.

Further in this case, the cooling apparatus includes a plurality of the heat radiating members, wherein the housing includes a heat generating source and wherein the plurality of heat radiating members are provided on both sides of the heat generating source.

In this case, each of the heat absorbing unit and the heat radiating unit is a fin.

Also in this case, each of the heat absorbing unit and the heat radiating unit includes a plurality of fins, and wherein each of the plurality of fins is provided along a substantially vertical direction of the housing.

Further in this case, the cooling apparatus further includes a heat conducting plate provided to thermally conduct heat inside the housing to the heat absorbing unit.

In this case, the cooling apparatus includes a plurality of the heat radiating members, wherein the housing includes a heat generating source, wherein the plurality of heat radiating members are provided on both sides of the heat generating source and wherein the cooling apparatus further includes a heat conducting plate provided between a heat absorbing unit of a first heat radiating member and a heat absorbing unit of a second heat radiating member of the plurality of heat radiating members, to thermally conduct heat inside the housing to the heat absorbing units of the first and second heat radiating members.

Also in this case, the heat radiating member is made of a metal.

Further in this case, the path has another opening portion in a lower portion of the housing in addition to the opening portion and wherein the cooling apparatus further includes a supporting member provided in the other opening portion of the housing to support the heat radiating member such that the supporting member is projected from a lower surface of the housing.

In order to achieve still another aspect of the present invention, a method of cooling a housing includes the steps of providing a path inside the housing, the path being directed to a substantially vertical direction, and having an opening portion in an upper portion of the housing, thermally conducting heat inside the housing to the path and emitting the conducted heat from the opening portion by lifting up gas inside the path based on a difference between density of the gas inside the path and density of gas outside the path.

In this case, the step of providing the path includes providing the path which has another opening portion in a lower portion of the housing in addition to the opening portion.

Also in this case, the step of providing the path includes providing the path such that a surface area of the path is increased.

BRIEF DESCRIPTION OF THE DRAWINGS

A better understanding of the present invention will be made of a detailed description to be read in conjunction with the accompanying drawings, in which:

FIG. 4A is a sectional view for representing the cooling apparatus, taken along a line A—A of FIG. 3B;

FIG. 4B is a sectional view for indicating the cooling apparatus, taken along a line B—B of FIG. 3A; and FIG. 4C is a sectional view for showing the cooling apparatus, taken along a line C—C of FIG. 3A.

DESCRIPTION OF THE PREFERRED EMBODIMENTS

Referring now to drawings, a preferred embodiment of the present invention will be described.

It should be noted that a cooling apparatus used for a sealing, or encapsulated type housing, according to an embodiment of the present invention, is suitable for, for example, a sealing (encapsulated) type cabinet of a radio communication appliance used in an outdoor field.

CONSTRUCTION OF COOLING APPARATUS

Figure 1A:
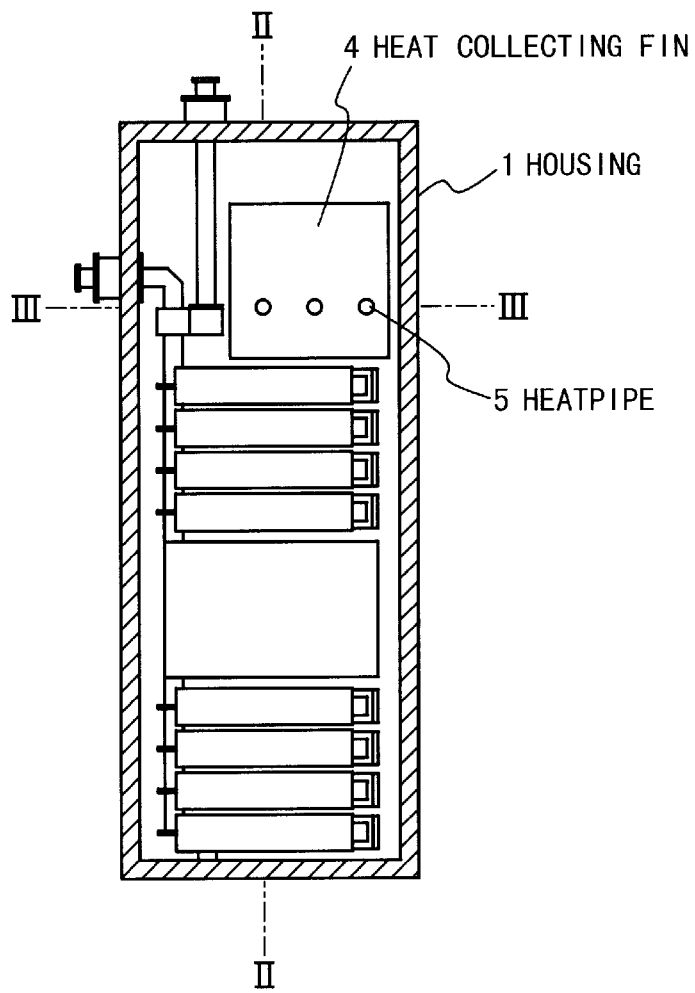
FIG. 1A is a sectional view for showing the front view of the conventional cooling apparatus for encapsulated type housing.
Figure 1B:
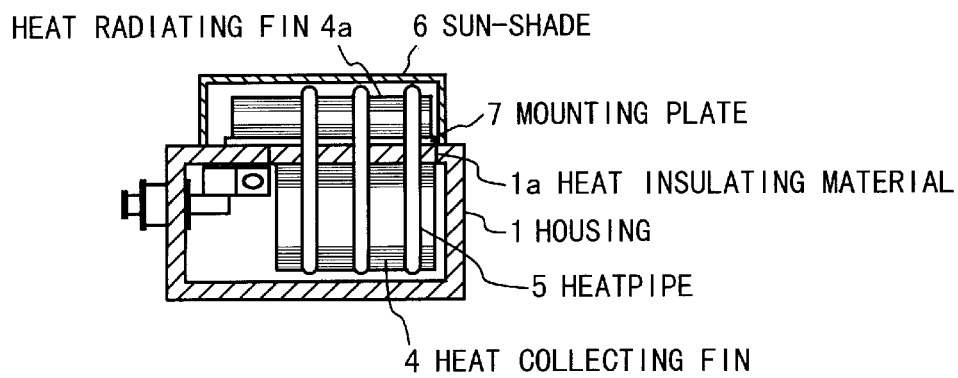
FIG. 1B is a sectional view for indicating the conventional cooling apparatus, taken along a line III—III of FIG. 1A.
Figure 2:
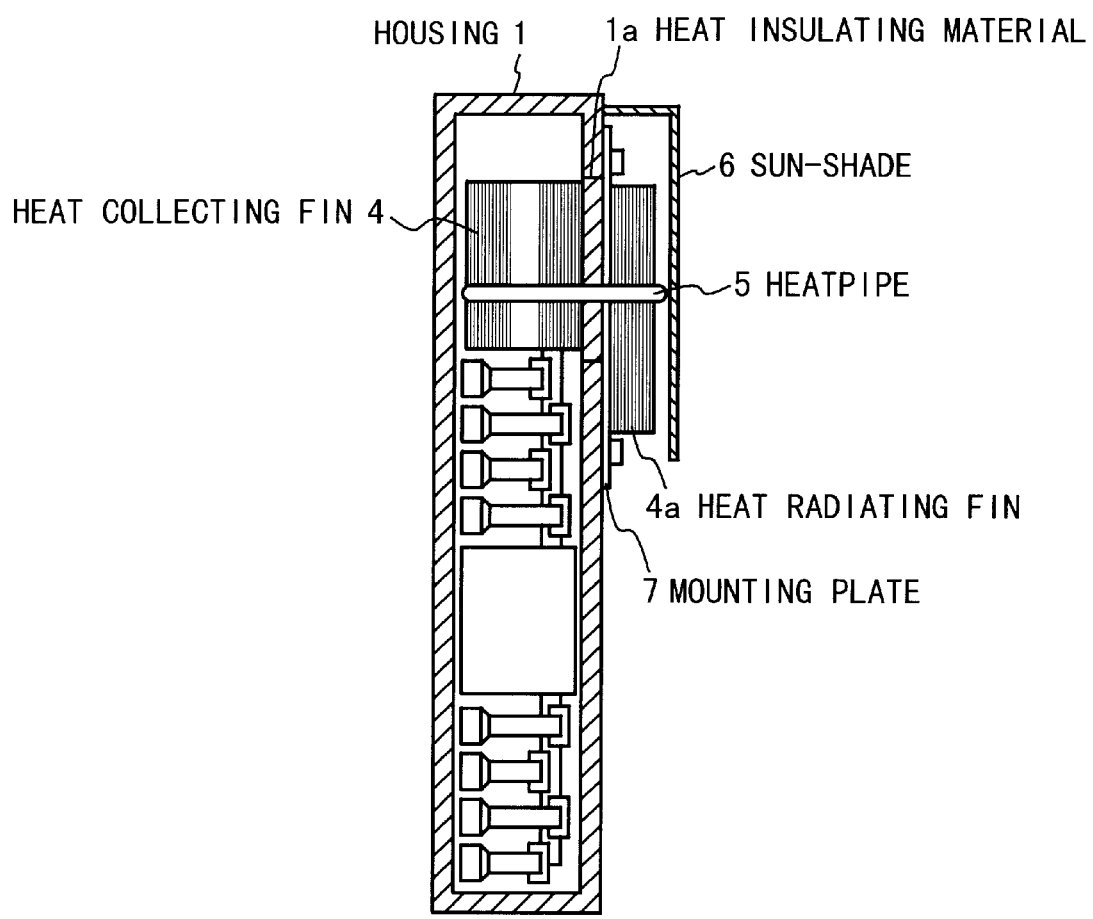
FIG. 2 is another sectional for representing the conventional cooling apparatus, taken along a line II—II of FIG. 1A.
Figure 3A:
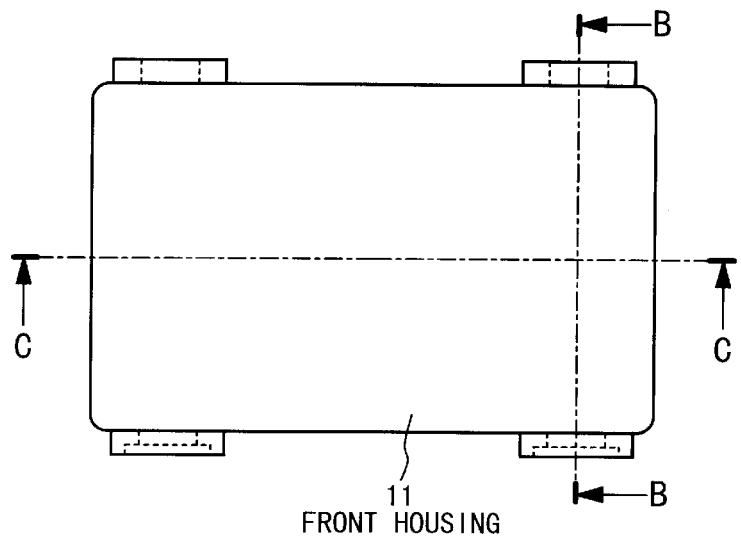
FIG. 3A is a front view for showing a cooling apparatus for an encapsulated type housing, according to an embodiment of the present invention.

In FIG. 3A to FIG. 4A, there is shown a cooling apparatus for a sealing (encapsulated) type housing, according to one preferred embodiment of the present invention. Precisely speaking, FIG. 3A is a front view for showing a cooling apparatus for an encapsulated type housing, according to this embodiment of the present invention. FIG. 3B is an upper side view for indicating the cooling apparatus for the encapsulated type housing of FIG. 3A. FIG. 3C is a lower side view for representing the cooling apparatus for the encapsulated type housing of FIG. 3A. FIG. 4A is a sectional view for representing the cooling apparatus, taken along a line A—A of FIG. 3B. FIG. 4B is a sectional view for indicating the cooling apparatus, taken along a line B—B of FIG. 3A. Furthermore, FIG. 4C is a sectional view for showing the cooling apparatus, taken along a line C—C of FIG. 3A.

Figure 3B:
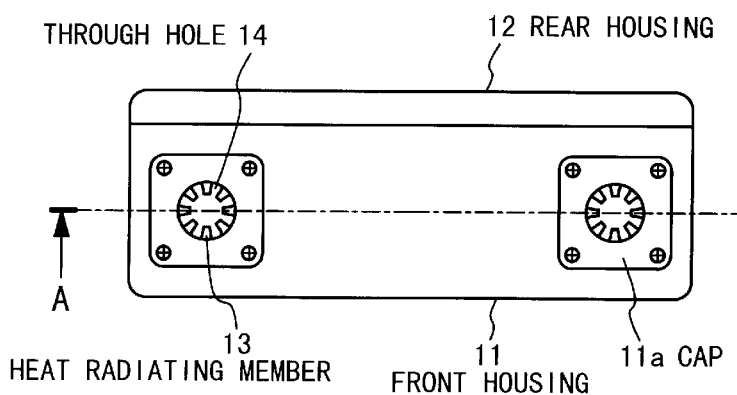
FIG. 3B is an upper side view for indicating the cooling apparatus for the encapsulated type housing, according to this embodiment of the present invention.
Figure 3C:
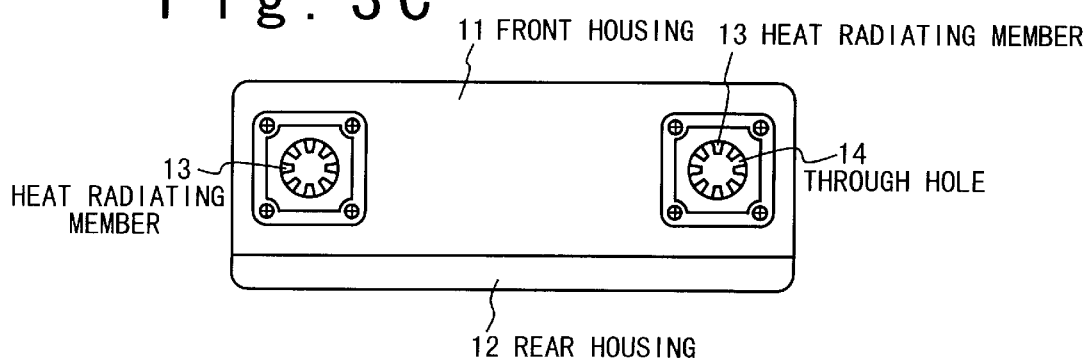
FIG. 3C is a lower side view for representing the cooling apparatus for the encapsulated type housing, according to this embodiment of the present invention.

As indicated in FIG. 3A and FIG. 3B, the cooling apparatus, according to this embodiment, includes a front housing 11, a rear housing 12, a 5 metal heat radiating member 13, and a cap 11a. This cap 11a is employed to hold the heat radiating member 13 in the front housing 11.

It should also be noted that although two sets of the above-explained heat radiating members 13 and 13 are actually employed in this cooling apparatus, only one heat radiating member 13 will be explained, if required.

Also, as indicated in FIG. 4A, this heat radiating member 13 is formed in a cylindrical shape, having a through hole 14. This through hole 14 is penetrated through this cylindrical-shaped heat radiating member 13 along upper/lower directions, as viewed in FIG. 4A. Two sets of opening portions are formed in upper/lower side surfaces of the front housing 11 at the positions corresponding to the through hole 14 of the heat radiating member 13. It should be understood that the above-described cap 11a is an auxiliary component including a water-proofed packing.

Also, as illustrated in FIG. 4A and FIG. 4C, a plurality of heat collecting fins 13a are formed on an outer side surface 13c of the cylindrical-shaped heat radiating member 13. These heat collecting fins 13a are projected outwardly in a radial direction and along the upper/lower directions. A plurality of heat radiation fins 13b are formed on an inner side surface 13d of the cylindrical-shaped heat radiation member 13 along the upper/lower direction. Each of the plurality of heat radiation fins 13b is formed as an arc-shaped notch portion which is expanded toward the outer side along the radial direction to increase the surface area of the inner side surface 13d.

Both end portions of the cylindrical-shaped heat radiation member 13 along an axial direction are mounted on the front housing 11 by using the above-explained caps 11a. The caps 11a are used to seal, or encapsulate portions of the opening portions of the front housing 11 except for the through hole 14. As a result, the inside portions of both the front housing 11 and the rear housing 12 can be completely sealed with respect to the external environment. Furthermore, the heat radiation fins 13b are not exposed outside the front housing 11.

As indicated in FIG. 4C, two sets of the above-described cylindrical-shaped heat radiation members 13 and 13 are arranged on both sides of a content 1b (for example, heat conducting plate) of this cooling apparatus. The heat conducting plate 1b is directly connected to the heat radiating fins 13a of the cylindrical-shaped heat radiating member 13 by employing a fastening member, for instance, a bolt. As indicated by broken lines in FIG. 4A and FIG. 4C, the heat conducting plate 1b is formed to be able to have a wide surface area between two sets of the above-described cylindrical heat radiating members 13 and 13. As a result, this heat conducting plate 1b can easily absorb heat of a space defined inside the front/rear housings 11 and 12.

HEAT RADIATION OPERATION OF COOLING APPARATUS

Referring now to FIG. 3A to FIG. 4C, heat radiation operation of the above-described cooling apparatus will be described.

The front housing 11 and the rear housing 12, into which a radio communication appliance (not shown in detail) has been stored, are installed under such a condition that the through hole 14 of the cylindrical-shaped heat radiating member 13 is directed along the upper/lower direction.

Heat existing inside the front/rear housings 11 and 12 may be absorbed by the heat collecting fins 13a formed on the outer side surface (namely, inside the sealed type front/rear housings 11/12) of the cylindrical-shaped heat radiating member 13. The heat absorbed by these heat collecting fins 13a may be radiated via the heat radiating fins 13b outside the front/rear housings 11/12. These heat radiating fins 13b are provided in an inside of the cylindrical-shaped heat radiating member 13, namely, on the side of the through hole 14 which is formed along the upper/lower directions of the front/rear housings 11/12, and is communicated with the external environment.

As a consequence, as apparent from the foregoing description, the heat existing inside the front/rear housings 11/12 can be effectively removed outside these front and rear housings 11 and 12 by a so-called "chimney effect" achieved by the above-explained through hole 14 extended along the upper/lower directions.

In this embodiment, this "chimney effect" implies that when air and/or other gas existing inside a vertical path is heated, density thereof is decreased, as compared with the density of air and/or other gas existing outside the vertical path, so that the air and/or other gas existing inside the vertical path is lifted up.

It should be understood that although two sets of the above-explained heat radiating members 13 and 13 are provided in FIG. 3A to FIG. 4C, one, or other arbitrary numbers of these heat radiating members may be arranged, if necessary. Also, the shape of the above-explained heat collecting fins 13a, or heat radiating fins 13b is not limited to that shown in FIG. 3A to FIG. 4C. If contact areas of heat collecting/radiating fins with respect to gas may be increased, then any shapes of these heat collecting/radiating fins may be alternatively employed.

As previously explained, in the cooling apparatus for the sealed type housing, according to this embodiment, the cylindrical-shaped heat radiating member 13 is arranged which is penetrated along the upper/lower directions of the sealed type housing, and the heat existing inside the front/rear housings 11/12 can be effectively removed outside these front/rear housings 11/12 by way of the above-explained "chimney effect" by this cylindrical-shaped heat radiating member 13.

Since the front housing 11 is coupled with the rear housing 12, a sealed type housing with a waterproof characteristic can be constructed. Also, in this embodiment, one set, or plural sets of opening portions are formed in any one of the front housing 11 and the rear housing 12. The opening portions are penetrated along the upper/lower direction. The above-explained cylindrical-shaped heat radiating members 13 and 13 are mounted on these opening portions. The upper/lower end portions of these cylindrical-shaped heat radiating members 13 are held, or supported on the peripheral portions of the opening portions by employing the auxiliary components 11a.

A plurality of heat collecting fins 13a are arranged on the outer surface of the cylindrical-shaped heat radiating member 13 along the upper/lower directions. These heat collecting fins 13 can absorb the heat existing inside this sealed type housing. Also, a plurality of heat radiating fins 13b are arranged on the inner surface of the cylindrical-type heat radiating member 13.

In accordance with this embodiment, the above-explained heat collecting fins 13a are positioned on the inside surfaces of the sealed type housings (front/rear housings) 11 and 12, namely on the outer side of the cylindrical-type heat radiating member 13. Also, the heat radiating fins 13b are provided on the inside surface of this cylindrical-shaped heat radiating member 13. The heat radiating member 13b may construct a portion of the through hole 14. This through hole 14 is penetrated via the opening portion of the sealed type housing 11 to the external environments along the upper/lower directions. The heat collecting fins 13a can absorb the thermal energy (internal heat) inside these sealed type housings 11 and 12. Thus, the internal heat absorbed by this heat collecting fin 13a can be radiated via the heat radiating fins 13b, and can be effectively removed outside the upper/lower (sealed type) housings 11/12 by way of the above-explained chimney effect.

Also, since the cylindrical-type heat radiating member 13 made of a metal is stored inside the sealed upper/lower housings 11 and 12, this heat radiating member 13 is not adversely influenced by direct heat by the sun. In other words, this heat radiating member 13 never absorbs unwanted heat energy which will be externally applied to this heat radiating member. As a consequence, this heat radiating member 13 can achieve the superior cooling efficiency.

As previously described in detail, in accordance with the cooling apparatus according to the present invention, the sealed, or encapsulated type housing for storing thereinto the radio (wireless) communication appliance is constituted by the front housing 11 and the rear housing 12. The through hole (namely, opening portion) is formed in one of the front housing 11 and the rear housing 12 along the upper/lower directions, and the cylindrical-type heat radiating member 13 is arranged at the position corresponding to this through hole. As a consequence, according to the cooling apparatus of the present invention, the sufficient heat radiating effect can be achieved without employing the heatpipe and the exposed type heat radiating member. Furthermore, according to the cooling apparatus of the present invention, both the water-proofing measure and the rain droplet-proofing measure of the sealed type housing can be made simple, and the total number of constructive components of this cooling apparatus can be reduced. In addition, the total weight of this cooling apparatus can be reduced, and also this cooling apparatus can be readily assembled in low cost.

What is claimed is:

1. In a housing for electrical equipment, at least one cooling device comprising:

a chimney structure extending in a first direction within said housing, wherein interior surfaces of said chimney structure define a heat expulsion passage that communicates exteriorly of said housing via an opening formed in said housing;

said chimney structure comprising exterior surfaces exposed to the interior of the housing, the interior of the housing being sealed from said passage;

said chimney structure further comprising plural heat collecting members projecting from said exterior surface of said chimney structure, interiorly of said housing, in a direction transverse to said first direction, said heat collecting members extending along said chimney structure in said first direction; and heat radiating members projecting transversely of said first direction into said passage from said interior surfaces of said chimney structure, and extending along said passage in said first direction;

whereby heat from within the interior of said housing is collected by said heat collecting members and transferred in said transverse direction to said heat radiating members within said passage, and thereafter expelled from said passage and said housing along said first direction.

2. The cooling device according to claim 1, wherein said chimney structure is substantially cylindrical.

3. The cooling device according to claim 1, wherein said plural heat collecting members are fins.

4. The cooling device according to claim 1, wherein said plural heat radiating members are fins.

5. The cooling device according to claim 2, wherein the plural heat collecting members and the plural heat radiating members are each a circular series of fins.

6. The cooling device according to claim 1, wherein said housing comprises at least two of said cooling devices, disposed at opposite sides of said housing.

7. The cooling device according to claim 6, further comprising a heat conducting plate member interconnecting at least one heat conducting member on a first cooling device with at least one heat conducting member on a second cooling device.

8. The cooling device according to claim 1, wherein said interior surfaces of said chimney structure also communicate exteriorly of said housing via a second opening formed at an opposite side of said housing, such that said passage spans said housing and extends entirely therethrough, thereby to permit expulsion of heat transferred from said plural heat collecting members to said plural heat radiating members, from opposite sides of said housing.

9. The cooling device according to claim 1, wherein said housing is formed from at least two housing elements that are secured together in a sealed manner.

10. The cooling device according to claim 9, wherein said at least one cooling device is provided within one of the at least two housing elements.

11. The cooling device according to claim 1, wherein said heat radiating members are made of metal.

12. The cooling device according to claim 1, wherein said chimney structure projects outwardly of said housing through said first opening.

13. The cooling device according to claim 8, wherein said chimney structure projects outwardly from said housing through both of said first and second openings.

14. A method of cooling a housing for electrical equipment, comprising providing at least one cooling device comprising:

a chimney structure extending in a first direction within said housing, wherein interior surfaces of said chimney structure define a heat expulsion passage that communicates exteriorly of said housing via an opening formed in said housing;

said chimney structure comprising exterior surfaces exposed to the interior of the housing, the interior of the housing being sealed from said passage;

said chimney structure further comprising plural heat collecting members projecting from said exterior surface of said chimney structure, interiorly of said housing, in a direction transverse to said first direction, said heat collecting members extending along said chimney structure in said first direction; and heat radiating members projecting transversely of said first direction into said passage from said interior surfaces of said chimney structure, and extending along said passage in said first direction;

conducting heat from within the interior of said housing by said heat collecting members;

transferring said heat in said transverse direction to said heat radiating members within said passage; and expelling said heat from said passage and said housing along said first direction.

15. The method according to claim 14, wherein said housing comprises at least two of said cooling devices, disposed at opposite sides of said housing.

16. The cooling device according to claim 15, further comprising a heat conducting plate member interconnecting at least one heat conducting member on a first cooling device with at least one heat conducting member on a second cooling device.

17. The cooling device according to claim 14, wherein said interior surfaces of said chimney structure also communicate exteriorly of said housing via a second opening formed at an opposite side of said housing, such that said passage spans said housing and extends entirely therethrough, thereby to permit expulsion of heat transferred from said plural heat collecting members to said plural heat radiating members, from opposite sides of said housing.

* * * * *